United States Patent [19]
Miyashita

[11] Patent Number: 5,898,341
[45] Date of Patent: *Apr. 27, 1999

[54] DIFFERENTIAL AMPLIFICATION CIRCUIT AND METHOD OF NOISE REMOVAL

[75] Inventor: Takumi Miyashita, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/622,056

[22] Filed: Mar. 26, 1996

[30] Foreign Application Priority Data

Apr. 10, 1995 [JP] Japan ................................. 7-110081

[51] Int. Cl.$^6$ ............................................... H03F 3/45
[52] U.S. Cl. ........................ 330/253; 330/258; 330/261
[58] Field of Search ............................ 330/9, 253, 258, 330/261

[56] References Cited

U.S. PATENT DOCUMENTS

| | | | |
|---|---|---|---|
| 4,616,189 | 10/1986 | Pengue, Jr. | 330/258 X |
| 4,808,944 | 2/1989 | Taylor | 330/253 |

*Primary Examiner*—James B. Mullins
*Attorney, Agent, or Firm*—Staas & Halsey

[57] ABSTRACT

A voltage Vdd–Vee amplified by a differential amplification circuit is provided to a common mode feedback circuit which controls an average potential of the Vdd and Vee to be constant by controlling a gate potential of an E-FET and to a level shift & common mode feedback circuit which controls an average potential of VDD and VBB to be constant by controlling a current mirror circuit having E-FETs via resistors and a diode. Output voltage VAA–VBB is used as an source & input voltage of a voltage controlled oscillator in a PLL circuit using a high frequency. Instead of the level shift & common mode feedback circuit, a differential offset circuit can be used with a pair of current being approximately equal to each other.

14 Claims, 8 Drawing Sheets

DIFFERENTIAL AMPLIFICATION CIRCUIT AND METHOD OF NOISE REMOVAL

BACKGROUND OF THE INVENTION

1. Field of the Invention

The present invention relates to a differential amplification circuit which performs differential amplification of complementary input signals and performs level shifting after the differential amplification, a semiconductor integrated circuit provided with this circuit and a method of noise removal.

2. Description of the Related Art

It is necessary to remove noise to a sufficient degree in a semiconductor integrated circuit provided with a high precision analog circuit. In particular, a semiconductor integrated circuit which includes both an analog circuit and a digital circuit, i.e., a PLL circuit that includes a frequency divider circuit, for instance, noise is communicated from the digital circuit to the analog circuit. Therefore, it is important to remove the noise in the analog circuit. The importance of noise removal increases as the frequency in the digital circuit increases to achieve higher speed.

FIG. 8 shows a schematic structure of a semiconductor integrated circuit. An amplifying circuit 10, a digital circuit 11 and an analog circuit 12 operate under a source voltage VCC supplied from the outside. The analog circuit 12 may be a voltage controlled oscillator, for instance, and the output VAA from the amplifying circuit 10 is supplied to the analog circuit 12 as an input signal and a source voltage. Since noise is communicated to the analog circuit 12 via the wiring of the input Vaa and the source voltage VCC of the amplifying circuit 10, the amplifying circuit 10 includes a noise filter.

However, increasing the capacity of the noise filter in order to remove the noise to a sufficient degree results in poor operating characteristics, decreasing response speed in the amplifying circuit 10.

SUMMARY OF THE INVENTION

Accordingly, an object of the present invention is to provide a differential amplification circuit and a method of noise removal with which noise can be removed from output potentials more than prior art without decreasing response speed.

According to the 1st aspect of the present invention, as shown in FIG. 2 for example, there is provided a differential amplification circuit comprising: an amplification circuit (3) for amplifying a voltage between a first input potential (Vaa) and a second input potential (Vbb) to get a voltage between a first output potential (Vdd) and a second output potential (Vee); and a common mode feedback circuit (50) for controlling the amplification circuit in such a way that an average of the first output potential and the second output potential becomes constant.

With the first aspect of the present invention, since the amplification circuit amplifies the voltage between the potentials Vaa and Vbb, the common mode noise included in the potentials Vaa and Vbb does not affect the output voltage Vdd–Vee. Accordingly, the common mode fluctuation difference Δ Vdd–Δ Vee is controlled to be 0. While, the average potential of the first output potential and the second output potential is controlled to be constant, namely the average fluctuation (Δ Vdd+Δ Vee) is controlled to be 0 by the common mode feedback circuit without restriction about noise.

In usual case, with the combination of the above two characters, the fluctuation of the voltage between the first output potential Vdd and the second output potential Vee by the noise is reduced more than prior art. This is confirmed by the simulation.

In the 1st mode of the 1st aspect of the present invention, as shown in FIG. 2 for example, said differential amplification circuit operate between a first source potential (VCC) and a second source potential (VEE), wherein the amplification circuit comprises a FET (32) as a current source; wherein the common mode feedback circuit (50) comprises: a level shift diode (53 and 55); a first FET (52) connected between the first source potential and the level shift diode; a first resistor (51A) connected between a gate of the first FET and the first output potential; a second resistor (51B) connected between the gate of the first FET and the second output potential; a second FET (55) connected between the level shift diode and the second source potential, a gate of the second FET being connected to a drain thereof and to a gate of the FET (32) of the amplification circuit.

With the first mode, in response to the fluctuation of the source voltage between the first and and second source potentials (VCC and VEE) due to noise, the first and second output potentials (Vdd and Vee) fluctuates. The fluctuation of the gate potential of the first FET (52) is proportional to the average fluctuation (Δ Vdd+Δ Vee) of the first and second output potentials.

When the source voltage (VCC–VEE) increases, then (Δ Vdd+Δ Vee)>0 and each of drain currents of the second FET (55) and the FET (32) of the amplification circuit increase, lowering the first and second output potentials (Vdd and Vee) and reducing the average fluctuation (Δ Vdd+Δ Vee) of the first and second output potentials.

Likewise, When the source voltage (VCC–VEE) decreases, then (Δ Vdd+Δ Vee)<0 and each of drain currents of the second FET (55) and the FET (32) of the amplification circuit decrease, raising the first and second output potentials (Vdd and Vee) and reducing the average fluctuation (Δ Vdd+Δ Vee) of the first and second output potentials.

Accordingly, (ΔVdd+Δ Vee) is controlled to be 0.

In the 2nd mode of the 1st aspect of the present invention, as shown in FIG. 3 or FIG. 4 for example, said differential amplification circuit operate between a first source potential (VCC) and a second source potential (VEE), wherein the amplification circuit (3) comprises a FET (32) as a current source; wherein the common mode feedback circuit (50A) comprises: first and second resistors (12A and 12B); a first FET (52A) connected between the first source potential and the first resistor, a gate of the first FET receiving the first output potential (Vdd); a second FET (52B) connected between the first source potential and the second resistor, a gate of the second FET receiving the second output potential (Vee); a level shift diode (53 and 54), an anode of the level shift diode being connected to the first and second resistors; a third FET (55) connected between a cathode of the level shift diode and the second source potential, a gate of the third FET being connected to a drain thereof and to a gate of the FET of the amplification circuit.

As the fluctuation of a potential at the anode of the level shift diode (53 and 54) is proportional to the (Δ Vdd+Δ Vee), like the same operation as the first mode is performed.

In the 3rd mode of the 1st aspect of the present invention, as shown in FIG. 1 for example, a level shift circuit (42B and 43B) for shifting down the second output potential (Vee) to get a first reference potential (VBB) and to provide an output voltage between a potential (VAA) corresponding to the first output potential (Vdd) and the first reference potential (VBB).

With the 3rd mode, source voltage (VAA−VBB) enough for the circuit to be applied is got under the condition that the first input potential (Vaa) is nearly equal to the second input potential (Vbb), performing symmetrical operation at the amplification circuit (30) and the common mode feedback circuit (40) and reducing the noise in the voltage (VAA−VBB) more effectively than non-symmetrical operation.

In the 4th mode of the 1st aspect of the present invention, as shown in FIG. 2 for example, the differential amplification circuit of the 1st aspect further comprises: a level shift & common mode feedback circuit (40) for shifting down the first and second output potentials (Vdd and Vee) by same voltage to get first and second reference potentials (VDD and VBB) respectively and to provide an output voltage between a potential(VAA) corresponding to the first output potential (Vdd) and the second reference potential (VBB) and for controlling an average of the first and second reference potentials to be constant.

With the 4th mode, since control is performed in such a manner that the average potential of the first output potential and the second output potential is constant in both the common mode feedback circuit (50) and the level shift & common mode feedback circuit (40), control is achieved so that when the source voltage fluctuates due to noise, an effect on the voltage between the first output potential and the second output potential becomes small.

In the 5th mode of the 1st aspect of the present invention, as shown in FIG. 2 for example, the differential amplification circuit operates between a first source potential (VCC) and a second source potential (VEE) and the level shift & common mode feedback circuit (40) comprises: a first FET (41A), a gate of the first FET receiving the first output potential (Vdd); a second FET (41B), a gate of the second FET receiving the second output potential (Vee); a current mirror circuit having third, fourth and fifth FETs (46A, 46B and 46), gates of the third, fourth and fifth FETs being connected to each other, a drain of the fifth FET (46) being connected to the gate thereof, sources of the third, fourth and fifth FETs being connected to the second source potential (VEE); a first level shift diode (42A and 43A) connected between the first FET and the third FET; a second level shift diode (42B and 43B) connected between the second FET and the fourth FET; first and second resistors (44A and 44B) connected in series to each other between a cathode of the first level shift diode and a cathode of the second level shift diode; and a common diode, a cathode of the common diode (45) being connected to a drain of the fifth FET, anode of the common diode being coupled to a potential of a point between the first and second resistors.

With the fifth mode, the fluctuation of the anode potential of the common diode (45) is proportional to the average fluctuation (Δ VAA+Δ VBB) of the (VAA+VBB).

When the source voltage (VCC−VEE) increases, then (Δ VAA+Δ VBB) >0 and each of drain currents of the third FET (46A) and the fourth FET (46B) increase, lowering the (VAA and VBB) and reducing the average fluctuation (Δ VAA+Δ VBB).

Likewise, When the source voltage (VCC−VEE) decreases, then (Δ VAA+Δ VBB)<0 and each of drain currents of the third FET (46A) and the fourth FET (46B) decrease, raising the (VAA and VBB) and reducing the average fluctuation (Δ AA+Δ VBB).

Accordingly, (Δ VAA+Δ VBB) is controlled to be 0 by the level shift & common mode feedback circuit (40) as well as (Δ Vdd+Δ Vee) is controlled to be 0 by the CMFB circuit (50).

In the 6th mode of the 1st aspect of the present invention, as shown in FIG. 5 for example, the differential amplification circuit of the 1st aspect further comprises: a differential offset circuit (60) including: a load element (62); a first transistor (61A) connected between the load element and the first source potential; a current source (63) connected between the load element and the second source potential; and a second transistor (61B), one end of the second transistor being connected to the source potential; control inputs of the first and second transistors (61A and 61B) receiving the first and second output potentials (Vdd and Vee) respectively, and the differential offset circuit (60) outputting a voltage between another end of the second transistor (61B) and the one end of the current source (63).

With the 6th mode, an impedance of the load element (62) is set approximately equal to the impedance of an object circuit to which the output of the differential offset circuit is supplied as a source voltage, and the first input potential and the second input potential are set to approximately equal to each other. Under these conditions, control is performed so that the fluctuation of current flowing through the object circuit becomes small when fluctuation is in the source potential lines due to noise, reducing the fluctuation of output voltage (VAA−VBB).

In the 7th mode of the 1st aspect of the present invention, the differential amplification circuit is a combination of the first mode and the 6th mode.

In the 8th mode of the 1st aspect of the present invention, the differential amplification circuit is a combination of the second mode and the 6th mode.

In the 9th mode of the 1st aspect of the present invention, as shown in FIG. 7 for example, the differential amplification circuit operates between a first source potential (VCC) and a second source potential (VEE) and further comprises a differential offset circuit (70A) including: a load element (74); a first control means (71B), connected between the load element and the first source potential and having a first control input, for controlling a current flowing through the first control means (71B) in correspondence to a potential at the first control input, the first control input receiving a potential corresponding to the first output potential (Vdd); a current mirror circuit (73) having a first input, a second input and an output connected to the second source potential, a current flowing into the first input being in proportion to a current flowing into the second input; a level shift circuit (75) connected between the first control means and the first input of the current mirror circuit; and a second control means (71A), connected between the first source potential and the second input and having a second control input, for controlling a current flowing through the control means in correspondence to a potential at the second control input, the second control input receiving a potential corresponding to the second output potential (Vee); the differential offset circuit (70A) outputting a voltage (VAA−VBB) between an input of the load element (74) and the second input of the current mirror circuit (73).

With the 9th mode, the restriction condition of the 6th mode in using the differential amplification circuit can be removed because the current flowing through the first control means and the current flowing through the second control means can be made approximately equal to each other even if the first input potential and the second input potential are not approximately equal to each other. Control is performed so that the fluctuation of current flowing through the object circuit becomes small when fluctuation is in the source potential lines due to noise, reducing the fluctuation of output voltage (VAA−VBB).

In the 10th mode of the 1st aspect of the present invention, the differential amplification circuit is a combination of the first mode and the 9th mode.

In the 11th mode of the 1st aspect of the present invention, the differential amplification circuit is a combination of the second mode and the 9th mode.

In the 12th mode of the 1st aspect of the present invention, as shown in FIG. 7 for example, the differential amplification circuit of the 1st aspect further comprises: an intermediate buffer circuit (80) receiving the first and second output potentials (Vdd and Vee) to provide first and second buffered potential corresponding to the first and second output potentials, the intermediate buffer circuit(80) having high input impedance compared to an output impedance thereof; the first and second buffered potentials being the potentials corresponding to the first and second output potentials.

With the 12th mode, an input impedance of the differential amplification circuit becomes high.

In the 13th mode of the 1st aspect of the present invention, as shown in FIG. 7 for example, the differential amplification circuit according operates between a first source potential (VCC) and a second source potential (VEE) and the intermediate buffer circuit (80) comprises: first and second resistors (82A and 82B); a first FET (81A) connected between the first source potential and the first resistor, a gate of the first FET receiving the first output potential (Vdd); a second FET (81B) connected between the first source potential and the second resistor, a gate of the second FET receiving the second output potential (Vee); a third FET (83A) connected between the first resistor and the second source potential; and a fourth FET (83B) connected between the second resistor and the second source potential.

In the 14th mode of the 1st aspect of the present invention, as shown in FIG. 7 for example, the differential amplification circuit of the 1st aspect further comprises: a second common mode feedback circuit (90) for controlling average potential of the first buffered potential and the second buffered potential of the intermediate buffer circuit (80) to be constant.

With the 14th mode, as the average potential of the first buffered potential and the second buffered potential at outputs of the intermediate buffer circuit (80) is controlled to be constant by the second common mode feedback circuit (90), and the average potential of the first output potential and the second output potential at outputs of the amplification circuit 30 is controlled to be constant by the common mode feedback circuit (50), improving a noise removal ratio.

In the 15th mode of the 1st aspect of the present invention, as shown in FIG. 7 for example, the differential amplification circuit operates between a first source potential (VCC) and a second source potential (VEE), the intermediate buffer circuit (80) comprises a FET (83A and 83B) as a current source, and the second common mode feedback circuit (90) comprises: a level shift diode (94); first and second FETs (93 and 92) connected in series between the first source potential and the level shift diode; a first resistor (91A) connected between a gate of the second FET (92) and the first reference potential (VAA); a second resistor (91B) connected between the gate of the second FET and the second reference potential (VBB); a third FET (95) connected between the level shift diode and the second source potential, a gate of the third FET being connected to a drain thereof and to a gate of the FET of the intermediate buffer circuit (80).

With the 15th mode, the first FET (93) reduces the fluctuation of a potential between the first and second FETs 92 caused by fluctuations in the first source potential (VCC) and the first reference potential (VAA), being able to be approximately equalized to the potential between the first and second FETs 92, becomes stable.

In the 16th mode of the 1st aspect of the present invention, as shown in FIG. 1 for example, the differential amplification circuit of the 1st aspect further comprises: an input buffer circuit (20) connected at a preceding stage of the amplification circuit (30), the input buffer circuit having a high input impedance compared to an output impedance thereof and outputting the first input potential and the second input potential (Vaa and Vbb).

With the 16th mode, an input impedance of the differential amplification circuit becomes high.

According to the 2nd aspect of the present invention, as shown in FIG. 2 for example, there is provided a semiconductor integrated circuit comprising: an amplification circuit (30) for amplifying a voltage between a first input potential and a second input potential to get a voltage between a first output potential and a second output potential; and a common mode feedback circuit (50) for controlling the amplification circuit in such a way that an average of the first output potential and the second output potential becomes constant.

According to the 3rd aspect of the present invention, there is provided a method of noise removal, comprising the steps of: amplifying a voltage between a first input potential and a second input potential to get a voltage between a first output potential and a second output potential, the first input potential being approximately equal to the second input potential; controlling an average potential of the first output potential and the second output potential to be constant; and shifting down the second output potential to get a first reference potential and to provide an output voltage between a potential corresponding to the second output potential and the first reference potential.

DESCRIPTION OF THE PREFERRED EMBODIMENTS

Figure 1:
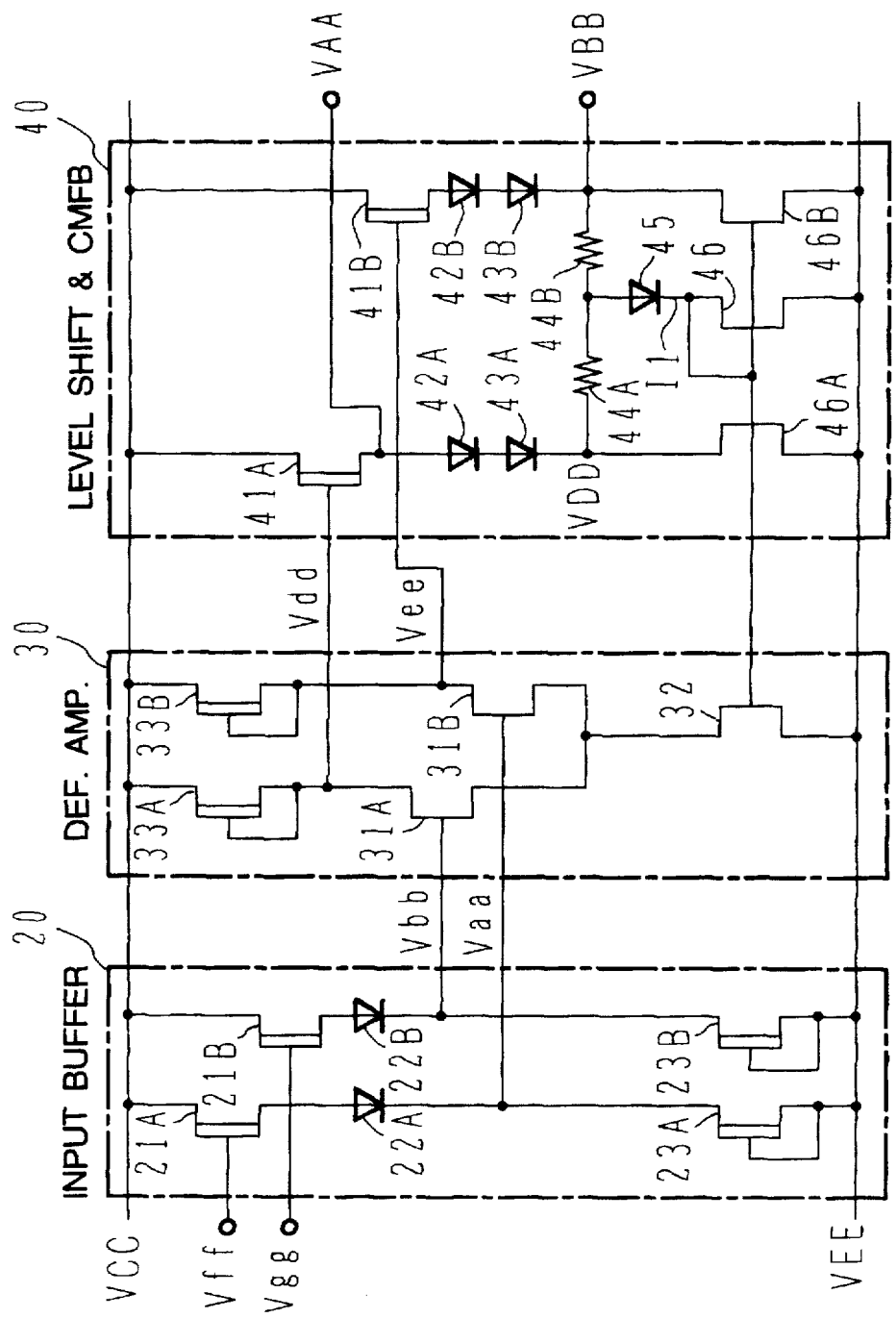
FIG. 1 shows a differential amplification & output offset circuit according to the present invention in the first embodiment.

Referring now to the drawings, wherein like reference characters designate like or corresponding parts throughout several views, preferred embodiments of the present invention are described below.

1. First Embodiment

FIG. 1 shows a differential amplification & output offset circuit in the first embodiment.

In this circuit, an input buffer circuit 20, a differential amplification circuit 30 and a level shift & common mode feedback (CMFB) circuit 40, all of which have symmetrical structures, are connected in cascade and a pair of source potentials VAA and VBB, which correspond to a pair of input potentials Vaa and Vbb, are output.

The drain of a depression mode MESFET (D-FET) 21A in the input buffer circuit 20 is connected to a source voltage line VCC, with its source connected to a source voltage line VEE via a diode 22A for level shift and a D-FET 23A, and a potential Vff is supplied to the gate of the D-FET 21A. The D-FET 23A is shorted between the gate and the source, operates in a saturation region and functions as a constant current source.

A D-FET 21A has high input impedance and the potential Vff is set within a range that ensures that the current flowing between the gate and the source of the D-FET 21A is at approximately 0. At this point, the voltage between the gate and the source in the D-FET 21A is approximately 0. The voltage between the terminals of the diode 22A is approximately 0.65 V, regardless of the value of the potential Vff, and the cathode potential Vaa of the diode 22A is equal to Vff−0.65 V.

A D-FET 21B, a diode 22B and a D-FET 23B correspond to the D-FET 21A, the diode 22A and the D-FET 23A, respectively, and a potential Vgg is supplied to the gate of the D-FET 21B with the cathode potential Vbb of the diode 22B being equal to Vgg−0.65 V.

In the differential amplification circuit 30, the potentials Vbb and Vaa are supplied to the gates of enhancement mode MESFET, (E-FET) 31A and E-FET 31B, respectively, and the sources of the E-FET 31A and the E-FET 31B are connected to the source voltage line VEE via an E-FET 32. The drains of the E-FET 31A and the E-FET 31B are connected to the source voltage line VCC via a D-FET 33A and a D-FET 33B respectively. The D-FET 33A and the D-FET 33B are both shorted between their gates and their sources and they are load FETs, which operate in an unsaturation region. With the drain potentials of the E-FET 31A and the E-FET 31B assigned as potentials Vdd and Vee respectively, Vdd−Vee=G(Vaa−Vbb) is true. In this relationship, G is a constant value within the range of, for instance, 10 to 20.

In the level shift & CMFB circuit 40, the drain of a D-FET 41A is connected to the source voltage line VCC, with its source connected to the source voltage line VEE via diodes 42A and 43A for level shift and an E-FET 46A, and the potential Vdd is supplied to the gate of the D-FET 41. A D-FET 41B, diodes 42B and 43B and an E-FET 46B correspond to the D-FET 41A, the diodes 43A and 43A and the E-FET 46A respectively, and the potential Vee is supplied to the gate of the D-FET 41B. Between the cathode of the diode 43A and the cathode of the diode 43B, a resistor 44A and a resistor 44B, whose resistance values are equal to each other, are connected in series, and the connecting point of the resistor 44A and the resistor 44B is connected to the source voltage line VEE via the diode 45 for level shift and an E-FET 46. The E-FET 46 is shorted between its gate and its drain and the gate of the E-FET 46 is connected to the gates of the E-FET 46A, the E-FET 46B and the E-FET 32 to constitute a current mirror circuit. Accordingly, the drain currents of the E-FET 46A, the E-FET 46B and the E-FET 32 are proportional to the drain current of the E-FET 46.

The electric current and the voltage between the gates and the sources in the D-FET 41A and the D-FET 41B are both approximately 0 and the voltage between the source potential VAA of the D-FET 41A and the cathode potential VBB of the diode 43B is expressed as VAA−VBB=Vdd−Vee+1.3 V.

Thus, $$VAA-VBB=G(Vff-Vgg)+1.3 \text{ V}. \tag{1}$$

The pair of potentials VAA and VBB are supplied to an analog circuit (not shown), i.e., a voltage controlled oscillator, for instance, as an input signal and a source voltage. The input potentials Vff and Vgg are determined through the equation (1) above, depending upon the output potentials VAA and VBB.

The potentials within the circuit shown in FIG. 1 at a given point in time may be as follows:

VCC=3.2 V, VEE=0.0 V
Vff=Vgg=2.2 V
Vaa=Vbb=1.6 V
Vdd=Vee=2.2 V
VAA=2.2 V, VBB=0.9 V

Since the differential amplification circuit 30 amplifies the voltage between the potential Vaa and the potential Vbb, the common mode noise included in the potential Vaa and th e potential Vbb does not affect the output voltage VAA−VBB.

Now, when the source voltage VCC−VEE fluctuates due to noise, and the cathode potentials VDD=VAA−1.3 and VBB of the diodes 43A and 43B fluctuate by Δ VDD and Δ VBB respectively, the electric current I1 flowing through the diode 45 fluctuates by Δ I1=(Δ VDD+Δ VBB)/R, with R being the resistance values of the resistors 44A and 44B.

When the source voltage VCC−VEE rises and Δ VDD+Δ VBB>0, then, Δ I1>0. The drain currents in the E-FET 46A and the E-FET 46B both increase, reducing the potentials VAA and VBB and lowering Δ VDD+Δ VBB. In addition, the drain current of the E-FET 32 also increases to lower the potentials Vdd and Vee and, consequently, Δ VDD+Δ VBB is reduced.

Likewise, when the source voltage VCC−VEE is lowered and Δ VDD+Δ VBB<0, then ΔI1<0. The drain currents of the E-FET 46A and the E-FET 46B both decrease to raise the potentials VAA and VBB, resulting in an increase in Δ VDD+Δ VBB. Also, the current flowing through the E-FET 32 becomes reduced, to raise the potentials Vdd and Vee, and thus Δ VDD+Δ VBB increases.

The results of a simulation confirm that even when the source voltage VCC−VEE fluctuates due to noise, control is performed so that the output voltage VAA−VBB is constant.

For instance, the output voltage VAA−VBB can be preferably used as an source & input voltage of a voltage controlled oscillator (VCO) in a PLL circuit using a high frequency, because an input noise from digital circuits such as a frequency divider to the VCO causes frequency and phase fluctuations and noise should be reduced especially in a high frequency region.

2. Second Embodiment

Figure 2:
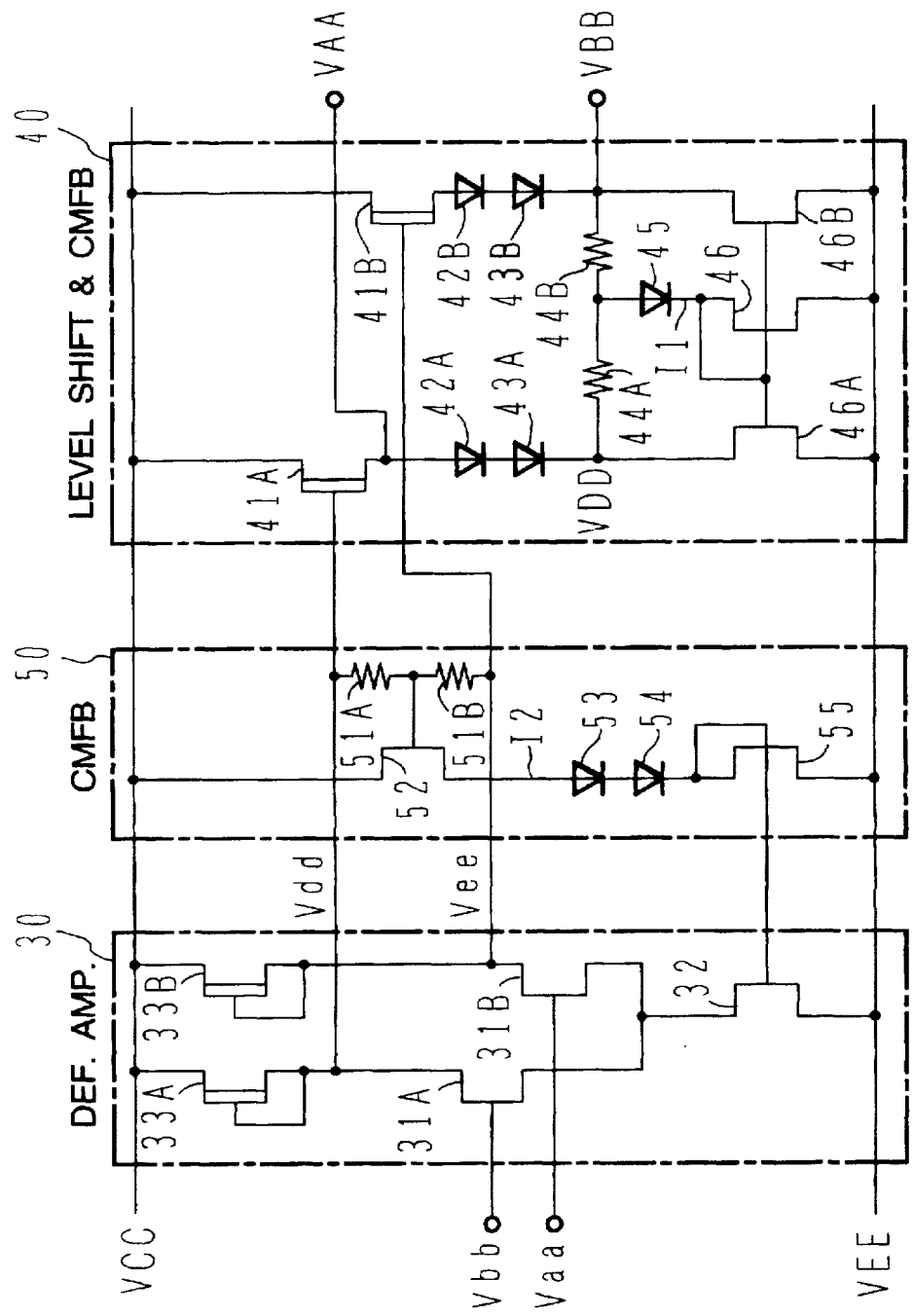
FIG. 2 shows a differential amplification & output offset circuit according to the present invention in the second embodiment.

FIG. 2 shows the differential amplification & output offset circuit in the second embodiment.

In this circuit, a CMFB circuit 50 is connected between the differential amplification circuit 30 and the level shift & CMFB circuit 40. The input buffer circuit 20, shown in FIG. 1, is omitted.

In the CMFB circuit 50, a resistor 51A and a resistor 51B, whose resistance values are equal to each other, are connected in series between the potential Vdd and the potential Vee, and their mid-point potential (Vdd+Vee)/2 is supplied to the gate of an E-FET 52. The drain of the E-FET 52 is connected to the source voltage line VCC, with its source connected to the source voltage line VEE via diodes 53 and 54 for level shift and an E-FET 55. The E-FET 55 is shorted between its gate and its drain with the gate being connected to the gate of the E-FET 32. The E-FET 32 and the E-FET 55 constitute a current mirror circuit and the drain current of the E-FET 32 is in proportion to the drain current of the E-FET 55.

When the potential VCC fluctuates, relative to the potential VEE due to noise and, consequently, the drain potentials Vdd and Vee of the E-FFET 31A and the E-FET 31B fluctuate by Δ Vdd and Δ Vee respectively, the drain current I2 of the E-FET 55 fluctuates by Δ I2=(Δ Vdd+Δ Vee)/R. R in this equation indicates the resistance values of the resistors 51A and 5IB.

When the source voltage VCC–VEE rises and Δ Vdd+Δ Vee>0, then the gate potential of the E-FET 52 rises and Δ I2>0, the drain current of the E-FET 32 increases to lower the potentials Vdd and Vee and Δ Vdd+Δ Vee becomes reduced.

Likewise, when the source voltage VCC–VEE decreases and Δ Vdd+Δ Vee<0, then Δ I2<0, the drain current of the E-FET 32 decreases, to raise the potentials Vdd and Vee and Δ Vdd+Δ Vee becomes increased.

As a result, as in the first embodiment, feedback control is performed so that an effect on the output voltage VAA–VBB become small.

In this embodiment, since the common mode noise of the drain potentials Vdd and Vee of the E-FET 31A and the E-FET 31B respectively, is fed back to the gate of the E-FET 32 via the CMFB circuit 50, the response speed for control is increased compared to a case in which feedback control is performed for the common mode noise of the potential VDD and the potential VBB in FIG. 1, which are downstream compared to the potentials Vdd and Vee and, consequently, the rate of noise removal for the output voltage VAA–VBB is improved.

3. Third Embodiment

In the CMFB circuit 50 shown in FIG. 2, it is necessary to set the resistance values of the resistors 51A and 51B to ensure that the currents flowing through the resistors 51A and 5IB affect little the potentials Vdd and Vee and, consequently, the time constant obtained through combining these resistance values and the gate capacity of the E-FET 52 becomes great, causing a delay in the response speed in feedback control.

Figure 3:
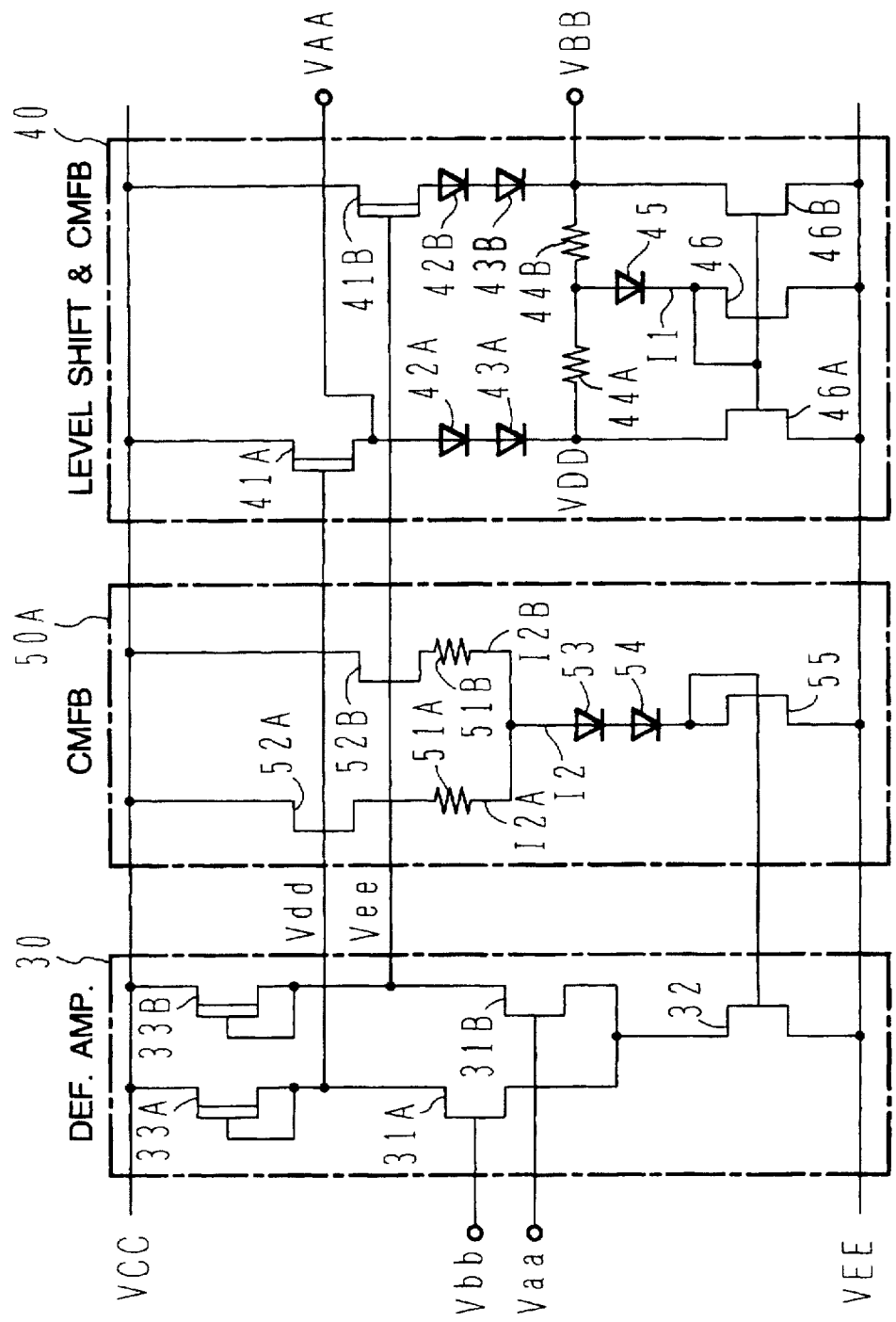
FIG. 3 shows a differential amplification & output offset circuit according to the present invention in the third embodiment.

To deal with this problem, in the differential amplification & output offset circuit in the third embodiment, a CMFB circuit 50A, which has a symmetrical structure, is employed in place of the CMFB circuit 50 in FIG. 2, as shown in FIG.3.

In the CMFB circuit 50A, the anode of the diode 53 is connected to the source voltage line VCC via the resistor 51A and the E-FET 52A at one side and also connected to the source voltage line VCC via the resistor 51B and an E-FET 52B at the other side, with potentials Vdd and Vee supplied to the gate of the E-FET 52A and the E-FET 52B respectively. Other features are identical to those of the CMFB circuit 50 shown in FIG. 2.

When the source voltage VCC–VEE rises and Δ Vdd+Δ Vee>0, then Δ I2>0. The source voltage VCC–VEE is lowered and Δ Vdd+Δ Vee<0, then ΔI2<0. Consequently, feedback control is performed in a similar manner to that in the case illustrated in FIG. 2.

Both the E-FET 52A and the E-FET 52B have high input impedance and the resistance values of the resistors 51A and 51B can be set lower than those in the case of FIG. 2. Consequently, the response speed for feedback control performed by the CMFB circuit 50A can be faster than the case illustrated in FIG. 2.

4. Fourth Embodiment

In the level shift & CMFB circuit 40 shown in FIG. 3, it is necessary to set the resistance values of the resistors 44A and 44B at high levels to ensure that the currents flowing through the resistors 44A and 44B affect little the potentials VAA and VBB and, consequently, the time constant obtained through combining these resistance values and the diode capacity becomes great, causing a delay in the response speed in feedback control.

Figure 4:
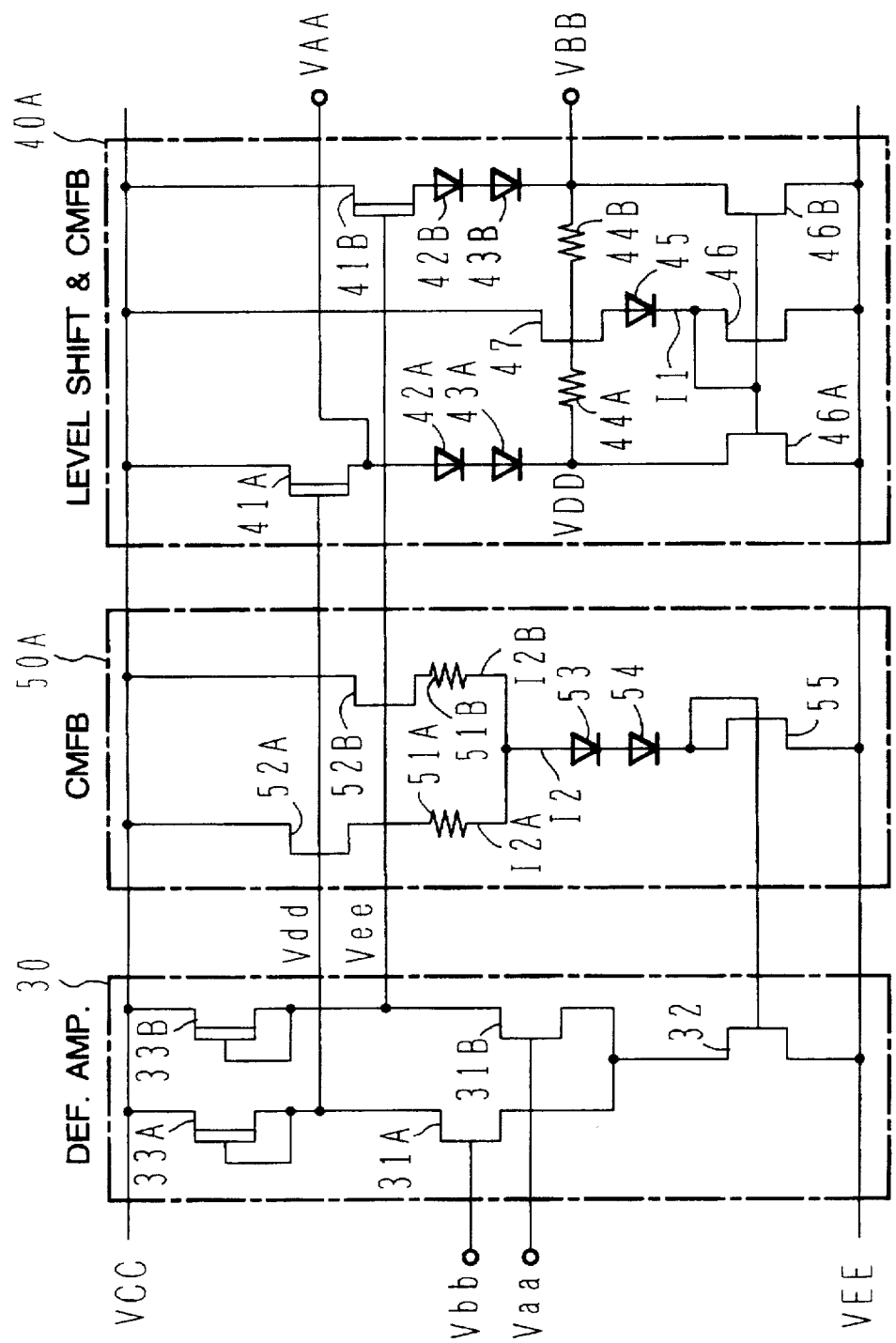
FIG. 4 shows a differential amplification & output offset circuit according to the present invention in the fourth embodiment.

To deal with this problem, in the differential amplification & output offset circuit in the fourth embodiment, as shown in FIG. 4, a level shift & CMFB circuit 40A, is employed in place of the level shift & CMFB circuit 40 shown in FIG.3.

In the level shift & CMFB circuit 40A, the anode of the diode 45 for level shift is connected to the source voltage line VCC via an E-FET 47and the connecting point of the resistors 44A and 44B is connected to the gate of the E-FET 47. Other features are identical to those of the level shift & CMFB circuit 40 shown in FIG. 3.

When Δ VDD+Δ VBB>0, then Δ I1>0 and when Δ VDD+Δ VBB<0, then ΔI1<0. Consequently, the feedback control is performed to ensure that noise becomes small in the output voltage VAA–VBB, as in the case shown in FIG. 3.

Since the E-FAT 47 has high input impedance, the resistance values of the resistors 44A and 44B can be reduced compared to the case shown in FIG. 3, reducing the time constant obtained by combining these resistance values with the diode capacity and the gate capacity of the E-FET 47 and increasing the response speed of the feedback control performed by the level shift & CMFB circuit 40A.

5. Fifth Embodiment

Figure 5:
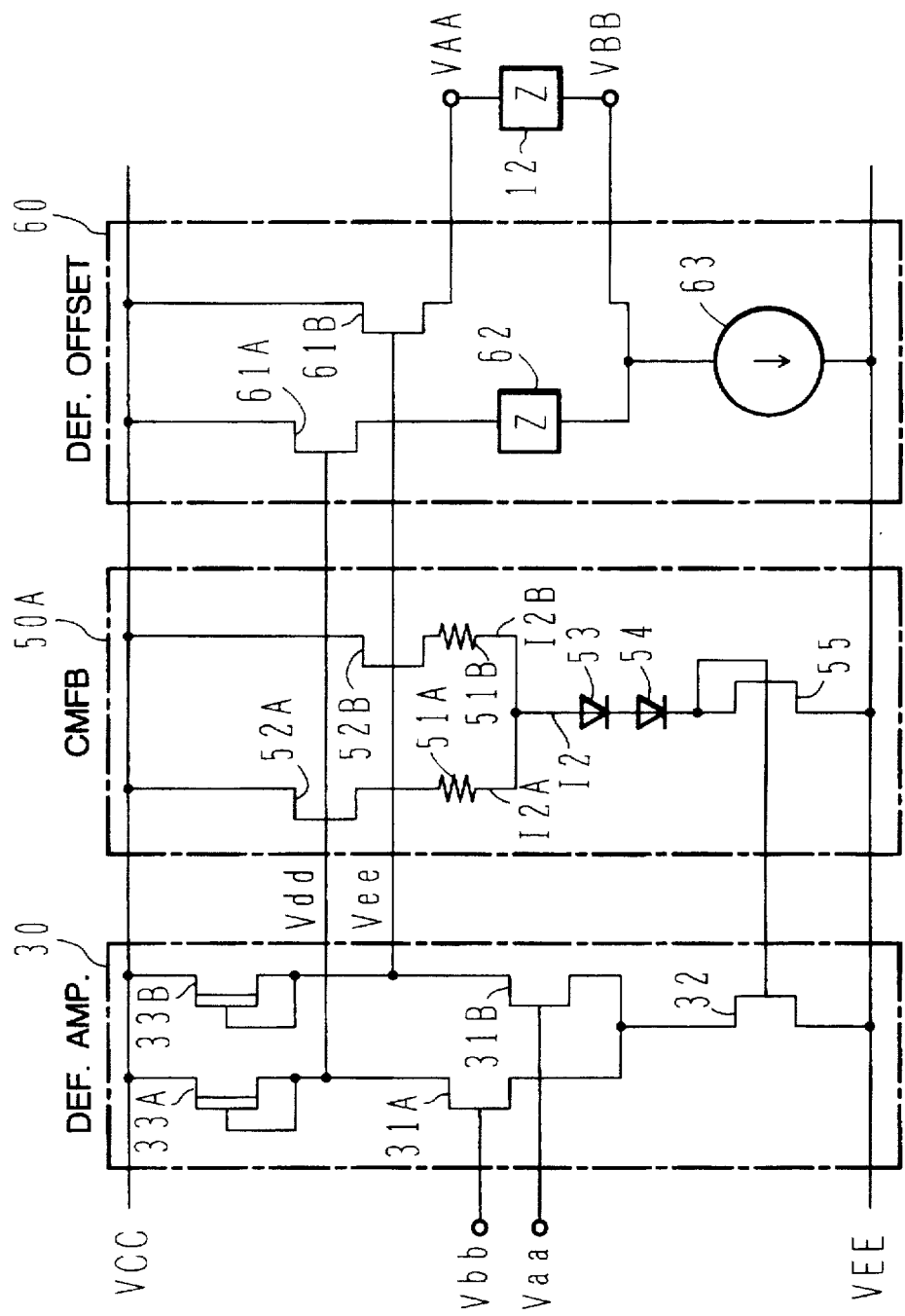
FIG. 5 shows a differential amplification & output offset circuit according to the present invention in the fifth embodiment.

FIG. 5 shows the differential amplification & output offset circuit in the fifth embodiment.

In this circuit, a differential offset circuit 60 is employed instead of the level shift & CMFB circuit 40A shown in FIG. 4.

In the differential offset circuit 60, the potentials Vdd and Vee are supplied to the gates of an E-FET 61A and an E-FET 61B respectively with the drains of the E-FET 61A and the E-FET 61B connected to the source voltage line VCC. The source of the E-FET 61A is connected to the source voltage line VEE via the equivalent impedance 62 and the current source 63. The source potential VAA of the E-FET 61B and the potential VBB at the current input of the current source 63 are supplied to an analog circuit 12 as source voltages. The equivalent impedance 62 is set approximately equal to the impedance of the analog circuit 12 under operating conditions.

Even if the potential VCC fluctuates due to noise relative to the potential VEE, the electrical current flowing to the current source is constant. Since the differential offset circuit 60 has a symmetrical structure, when Vaa=Vbb, the electrical current flowing through the analog circuit 12 is constant even if the voltage VCC–VEE fluctuates due to noise. As a result, the characteristic that VAA–VBB is constant is achieved. This characteristic is maintained when the value of Vaa–Vbb is small and the differential amplification & output offset circuit in FIG. 5 is utilized within the range in which this characteristic is maintained.

6. Sixth Embodiment

Figure 6:
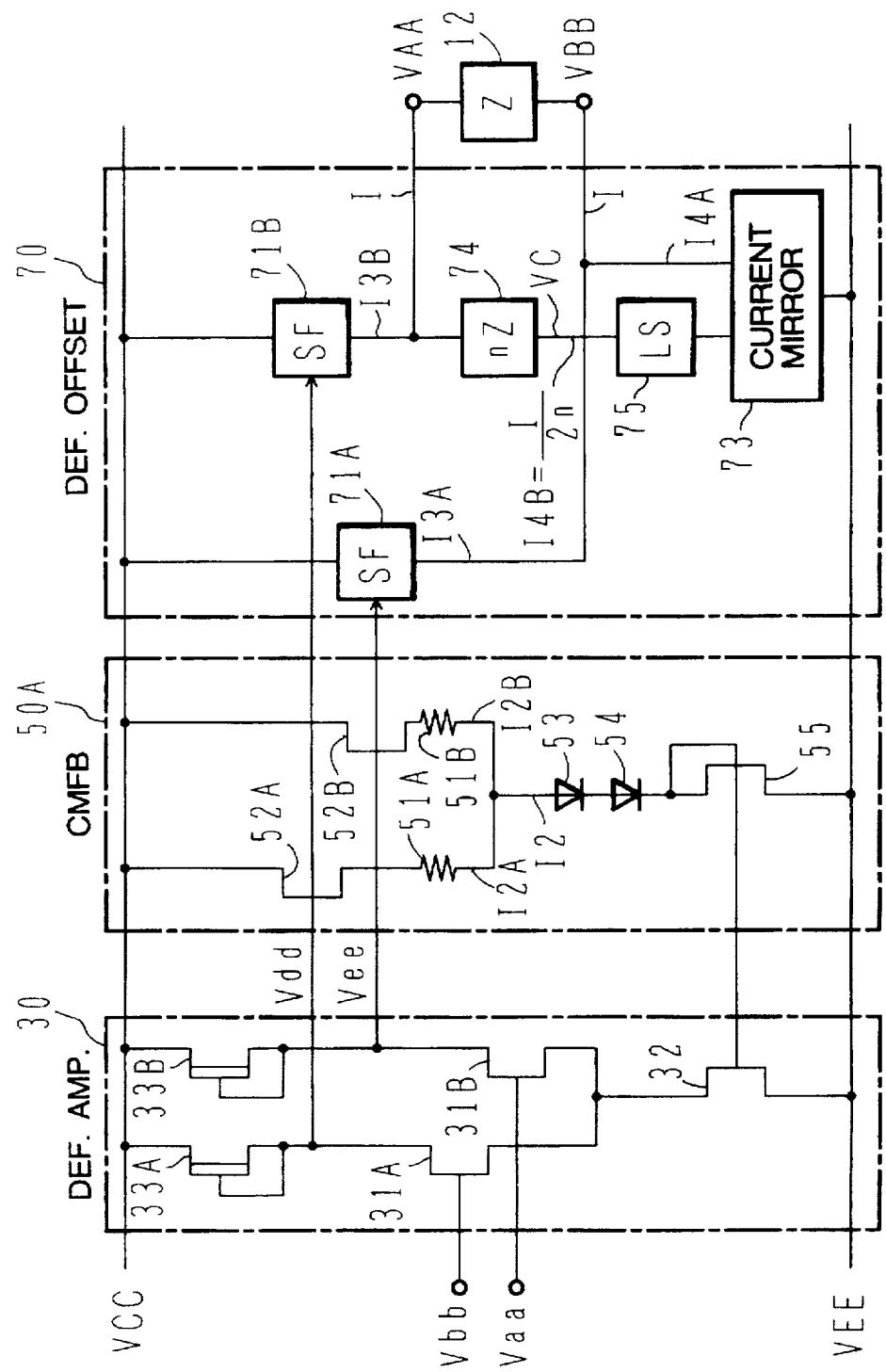
FIG. 6 shows a differential amplification & output offset circuit according to the present invention in the sixth embodiment.

FIG. 6 shows the differential amplification & output offset circuit in the sixth embodiment.

In this differential amplification & output offset circuit, by employing a differential offset circuit 70 instead of the differential offset circuit shown in FIG. 5, it is ensured that VAA–VBB is constant against fluctuations in the potential VCC even if the value of Vaa–Vbb is not small.

In the differential offset circuit 70, the potential Vee and the potential Vdd are supplied to the control inputs of a depression mode source follower 71A and a D-FET 71B respectively, and both the source follower 71A and the D-FET 71B are connected to the source voltage line VCC at one end. The other end of the source follower 71A is connected to one of the current inputs of a current mirror circuit 73 via the equivalent impedance 62 and the other end of the D-FET 71B is connected to the other current input of the current mirror circuit 73 via the equivalent impedance 74 and a level shifter 75. The current output of the current mirror circuit 73 is connected to the source voltage line VEE. The electrical potential VAA at the other end of the D-FET 71B and the electrical potential VBB at one of the current inputs of the current mirror circuit 73 are supplied to the analog circuit 12.

The equivalent impedance 74 is set to have n times the impedance Z of the analog circuit 12. The level shifter 75 is set up in such a manner that the potential VC at the connecting point of the equivalent impedance 74 and the level shifter 75 is, for instance, (VAA+VBB)/2.

When the electrical current flowing through the analog circuit 12 is I, and the electrical currents flowing through one and the other of the current inputs of the current mirror circuit 73 are designated I4A and I4B respectively, $$I4B=I/(2n). \quad (2)$$

If the current mirror circuit 73 is constituted to ensure that $$I4A: I4B=X: 1, \quad (3)$$

$$I4A=\{X/(2n)\}I \quad (4)$$

from equations (2) and (3).

When the electrical currents flowing through the source follower 71A and the D-FET 71B are designated I3A and I3B respectively, $$I3A=I4A-I=\{X/(2n)-1\}I \quad (5)$$

and $$I3B=\{1+1/(2n)\}I, \quad (6)$$

Thus, when X=4n+1, then I3A=I3B and, consequently, even if the potential VCC fluctuates due to noise, VAA–VBB is maintained at a nearly constant level.

In order to maintain VAA–VBB at an even more constant level, the equivalent impedance 62 in FIG. 5 may be inserted in the area where the electrical current I3A runs, in correspondence to the analog circuit 12, to achieve a more symmetrical structure.

7. Seventh Embodiment

Figure 7:
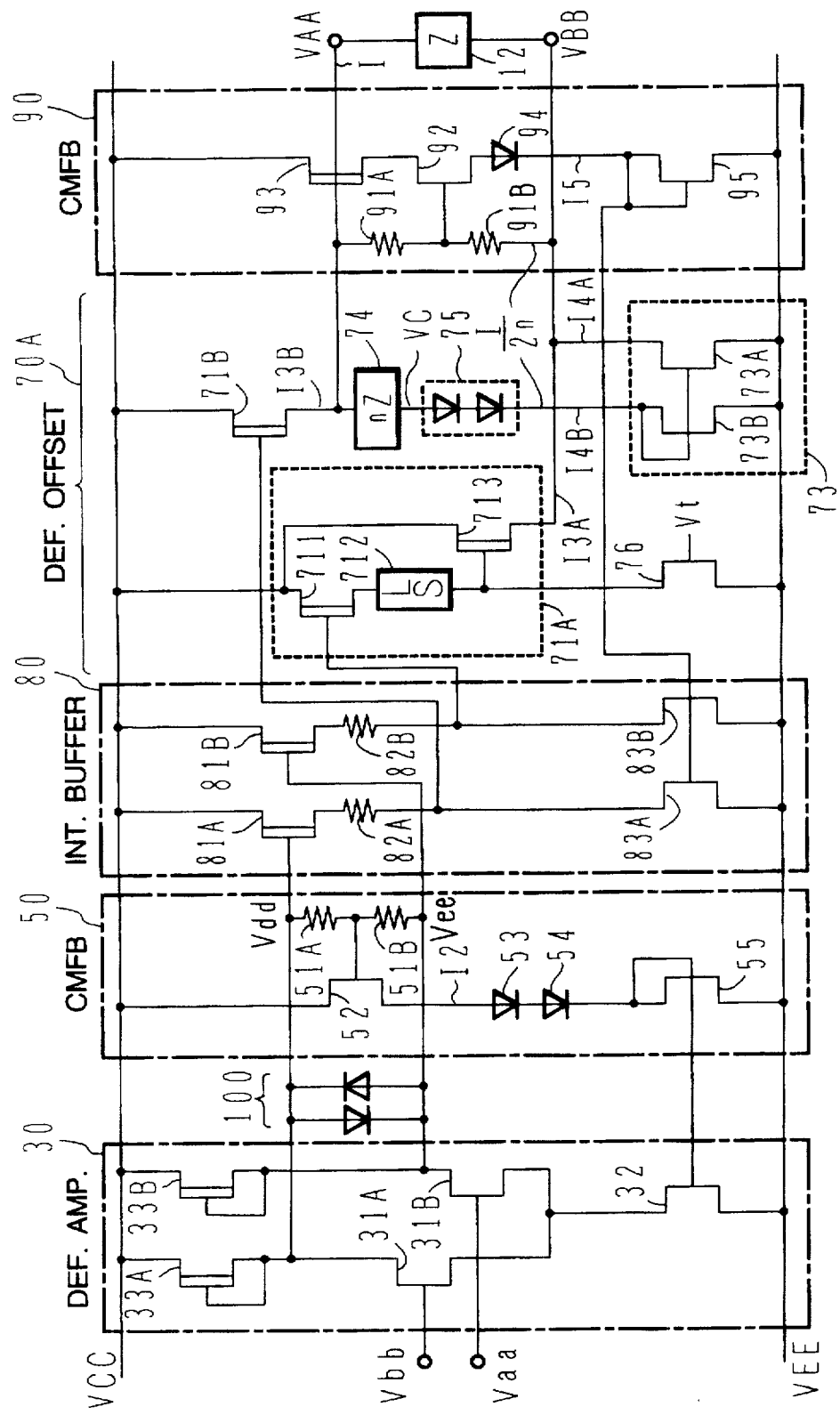
FIG. 7 shows a differential amplification & output offset circuit according to the present invention in the seventh embodiment.
Figure 8:
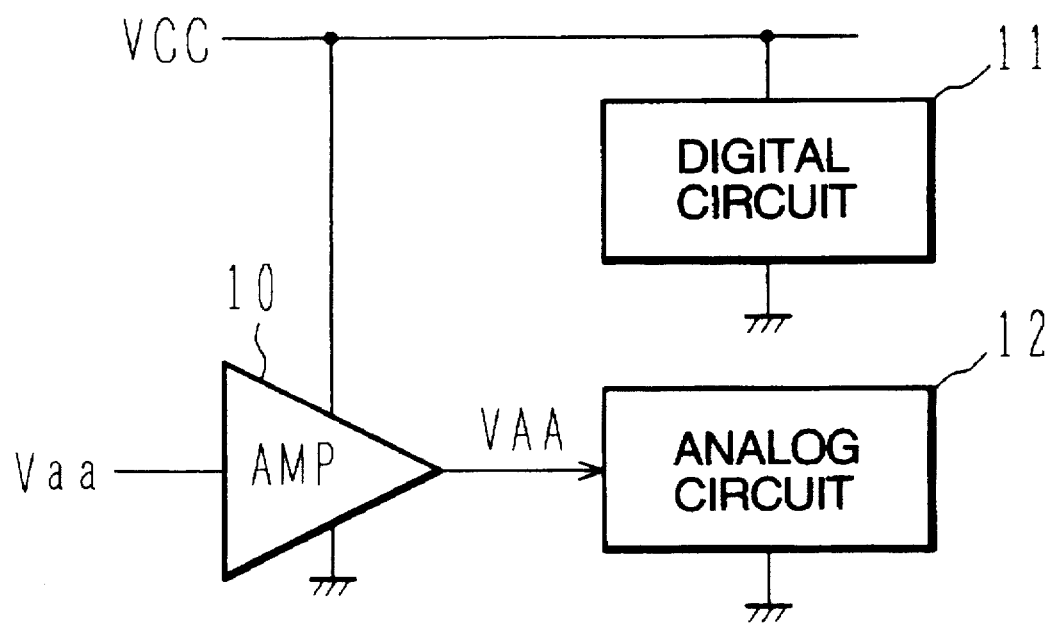
FIG. 8 shows a prior art circuit.

FIG. 7 shows the differential amplification & output offset circuit in the seventh embodiment.

In this differential amplification & output offset circuit, a specific circuit 70A is employed as the differential offset circuit 70 shown in FIG. 6. An intermediate buffer circuit 80 and a CMFB circuit 90 are connected at the preceding level and the subsequent level relative to this circuit 70A.

In the source follower 71A, the source of a D-FET 711 is connected to the gate of a D-FET 713 via a level shifter 712 and the drain of the D-FET 713 is connected to the drain of the D-FET 711, with the drain of the D-FET 711 and the source of the D-FET 713 constituting the aforementioned one end and other end respectively of the source follower 71A, and the gate of the D-FET 711 constituting the control input of the source follower 71A.

The current mirror circuit 73 is constituted with an E-FET 73A and an E-FET 73B, and the level shifter 75 is constituted by connecting two diodes in series.

With the gate of the D-FET 713 constituting a second control input of the source follower 71A, an E-FET 76 connected between this control input and the source voltage line VEE and the potential corresponding to the chip temperature supplied to the gate of the E-FET 76, the electrical current flowing through the analog circuit 12 is prevented from fluctuating due to fluctuations in temperature.

The equations (2) to (4) are true in this seventh embodiment, too. With the impedance of resistors 91A and 91B at, for instance, nZ, in correspondence to the equations (5) and (6) above, $$I3A=I4A-I-I/(2n)=\{(X-1)/(2n)-1\}I, \quad (5')$$

$$I3B=(1+1/n)I \quad (6').$$

Consequently, when X=4n+2, then I3A=I3B, and even if the potential VCC fluctuates due to noise, VAA–VBB is maintained at a nearly constant level.

The intermediate buffer circuit 80 is the object of the feedback control performed by the CMFB circuit 90 and has a symmetrical structure. In the intermediate buffer circuit 80, the drain of a D-FET 81A is connected to the source voltage line VCC, with its source connected to the source voltage line VEE via resistors 82A and 83 and the potential Vdd is supplied to the gate of the D-FET 81A. The D-FET 81A has high input impedance and the voltage and the electrical current between the gate and the source of the D-FET 81A are approximately 0. A D-FET 81B, a resistor 82B and an E-FET 83B correspond with the D-FET 81A, the resistor 82A and the E-FET 83B* respectively and the potential Vee is supplied to the gate of the D-FET 81B. The resistors 82A and 82B are provided to reduce the inconsistency and improve the linearity of the input/output characteristics of the D-FET 81A and the D-FET 81B. The drain potentials of the E-FET 83A and the E-FET 83B are supplied to the gates of the D-FET 71B and the D-FET 711 respectively.

The CMFB circuit 90 is similar to the CMFB circuit 50 and the resistors 91A and 91B, an E-FET 92, a diode 94 for level shift and an E-FET 95 correspond to the resistors 51A and 51B, the E-FET 52, the diode 54 and the E-FET 55 respectively, of the CMFB circuit 50. A D-FET 93, which is connected between the source voltage line VCC and the drain of the D-FET 92, reduces the fluctuation in the drain potential of the E-FET 92 caused by fluctuations in the potential VCC and the potential VAA is supplied to the gate of the D-FET 93. On account of the drain voltage of the D-FET 93, the diode 53 in the CMFB circuit 50 is omitted in the CMFB circuit 90. The gate of the E-FET 95 is connected to the gates of the E-FET 83A and the E-FET 83B, and the current mirror circuit is constituted with the E-FET 95, the E-FET 83A and the E-FET 83B with the drain currents of the E-FET 83A and the E-FET 83B being in proportion to the drain current of the E-FET 95.

When the potential VCC fluctuates relative to VEE due to noise, the potentials VAA and VBB fluctuate by $\Delta$ VAA and $\Delta$ VBB respectively, and $\Delta$ VAA+$\Delta$ VBB>0. The drain current I5 of the E-FET 92 increases and the drain currents of the E-FET 83A and the E-FET 83B also increase, and the gate potentials of the D-FET 711 and the D-FET 71B become reduced, and the currents I3A and I3B increase, reducing $\Delta$ VAA+$\Delta$ VBB. Likewise, when $\Delta$ VAA+$\Delta$ VBB<0, the current I5 becomes reduced and the currents I3A and I3B also become reduced, to increase $\Delta$ VAA+$\Delta$ VBB.

In the seventh embodiment, since the potentials Vdd and Vee are fed back to the differential amplification circuit 30 via the CMFB circuit 50, to reduce fluctuations in Vdd+Vee, and the output potentials VAA and VBB are fed back to the intermediate buffer circuit 80 via the CMFB circuit 90 to reduce fluctuations in the average potential of the potentials at the gates of the D-FET 71B and the D-FET 71ll, the stability of the source circuit against the common mode noise is improved.

A clipping circuit 100 controls the ranges of the potential VAA and the potential VBB.

Although preferred embodiments of the present invention has been described, it is to be understood that the invention is not limited thereto and that various changes and modifications may be made without departing from the spirit and scope of the invention.

For instance, although MES FETs are used for transistors in reference to the embodiments explained so far, the present invention may be constituted by employing MIS FETs or bipolar transistors, as is obvious from studying its principle. In addition, generally speaking, the source followers 71A and 71B may be replaced by various circuits for controlling the passing current in correspondence to the potential at the control input.

What is claimed is:

1. A differential amplification circuit comprising:

an amplification circuit, amplifying a voltage between first and second input potentials to obtain first and second output potentials, including a pair of FETs and a first current source FET, each of said pair of FETs and said first current source FET comprising a gate electrode and first and second electrodes conducting a current between its first and second electrodes, the second electrodes of said pair of FETs and the first electrode of said first current source FET being coupled to one another, the gate electrodes of said pair of FET receiving said first and second input potentials respectively, the first electrodes of said pair of FETs providing said first and second output potentials respectively; and a common mode feedback circuit comprising:

a common mode signal generating circuit generating a mean potential of said first and second output potentials and shifting down the mean potential to a potential as a common mode signal, and a second current source FET comprising a gate electrode, a source electrode, and a drain electrode receiving the common mode signal, the drain and gate electrodes of said second current source FET and the gate electrode of said first current source FET are short-circuited to make a current mirror circuit comprising said first and second current source FETs, wherein said common mode signal generating circuit comprises:

a first FET comprising a gate electrode and first and second electrodes for conducting a current between its first and second electrodes;

a first resistor coupled between the gate electrode of said first FET and the first electrode having said first output potential;

a second resistor coupled between the gate electrode of said first FET and the first electrode having said second output potential; and a level shift diode comprising an anode coupled to the second electrode of said first FET and comprising a cathode coupled to the first electrode of said second current source FET.

2. A differential amplification circuit comprising:

an amplification circuit, for amplifying a voltage between first and second input potentials to obtain first and second output potentials, including a pair of FETs and a first current source FET, each of said pair of FETs and said first current source FET comprising a gate electrode and first and second electrodes conducting a current between its first and second electrodes, the second electrodes of said pair of FETs and the first electrode of said first current source FET being coupled to one another, the gate electrodes of said pair of FET receiving said first and second input potentials respectively, the first electrodes of said Pair of FETs providing said first and second output potentials respectively; and a common mode feedback circuit comprising:

a common mode signal generating circuit generating a mean potential of said first and second output potentials and shifting down the mean potential to a potential as a common mode signal, and a second current source FET comprising a gate electrode, a source electrode, and a drain electrode receiving the common mode signal, the drain and gate electrodes of said second current source FET and the gate electrode of said first current source FET are short-circuited to make a current mirror circuit comprising said first and second current source FETs, wherein said common mode signal generating circuit comprises:

a first FET comprising a gate electrode coupled to the first electrode having said first output potential and first and second electrodes for conducting a current between its first and second electrodes;

a second FET comprising a gate electrode coupled to the first electrode having said second output potential and first and second electrodes for conducting a current between its first and second electrodes;

a level shift diode circuit comprising an anode and a cathode coupled to the drain electrode of said second current source FET;

a first resistor coupled between the second electrode of said first FET and the anode of said level shift diode; and a second resistor coupled between the second electrode of said second FET and the anode of said level shift diode.

3. A differential amplification circuit according to claim 2, further comprising a level shift circuit which comprises:

a first level shift diode circuit comprising an input coupled to the second electrode of said second FET and an output providing a third output potential (VBB); and an output voltage between the third output potential and a fourth output potential at the second electrode of said first FET being formed.

4. A differential amplification circuit according to claim 3, further comprising:

third and fourth FET gates of third and fourth FETs being connected to one another together with the gate of said second current source FET, drains of said third and fourth FETs being coupled to the second electrode of said first FET and the output of said first level shift diode circuit, respectively.

5. A differential amplification circuit according to claim 4, further comprising:

a second level shift diode circuit comprising an anode and a cathode, its anode being coupled to the second electrode of said first FET, its cathode being coupled to the drain electrode of said third FET.

6. A differential amplification circuit according to claim 2, said differential amplification circuit operating between a first source potential and a second source potential, further comprising a differential offset circuit comprising:

a load element, a first transistor connected between said load element and said first source potential, a current source connected between said load element and said second source potential, and a second transistor, one end of said second transistor being connected to said first source potential, control inputs of said first and second transistors receiving said first and second output potentials respectively, and said differential offset circuit outputting a voltage between said second transistor and said current source.

7. A differential amplification circuit according to claim 2, said differential amplification circuit operating between a first source potential and a second source potential, further comprising a differential offset circuit comprising:

a load element, a first control circuit, connected between said first source potential and said load element and having a first control input, for controlling a current flowing through said first control circuit in response to a potential at said first control input, said first control input receiving a potential corresponding to said first output potential, a current mirror circuit having a first input, a second input and an output connected to said second source potential, a current flowing into said first input being in proportion to a current flowing into said second input, a level shift circuit connected between said first control circuit and said first input of said current mirror circuit, and a second control circuit, connected between said first source potential and said second input and having a second control input, for controlling a current flowing through said second control circuit in response to a potential at said second control input, said second control input receiving a potential corresponding to said second output potential, said differential offset circuit outputting a voltage between an input of said load element and said second input of said current mirror circuit.

8. A differential amplification circuit according to claim 2, further comprising:

an input buffer circuit connected at a preceding stage of said amplification circuit, said input buffer circuit having a high input impedance compared to an output impedance thereof and outputting said first input potential and said second input potential.

9. A differential amplification circuit comprising:

an amplification circuit, for amplifying a voltage between first and second input potentials to obtain first and second output potentials, including a pair of FETs and a first current source FET, each of said pair of FETs and said first current source FET comprising a gate electrode and first and second electrodes conducting a current between its first and second electrodes, the second electrodes of said pair of FETs and the first electrode of said first current source FET being coupled to one another, the gate electrodes of said pair of FET receiving said first and second input potentials respectively, the first electrodes of said pair of FETs providing said first and second output potentials respectively; and a common mode feedback circuit comprising:

a common mode signal generating circuit generating a mean potential of said first and second output potentials and shifting down the mean potential to a potential as a common mode signal, and a second current source FET comprising a gate electrode, a source electrode, and a drain electrode receiving the common mode signal, the drain and gate electrodes of said second current source FET and the gate electrode of said first current source FET are short-circuited to make a current mirror circuit comprising said first and second current source FETs, said differential amplification circuit operating between a first source potential and a second source potential, further comprising a differential offset circuit comprising:

a load element, a first transistor connected between said load element and said first source potential, a current source connected between said load element and said second source potential, and a second transistor, one end of said second transistor being connected to said first source potential, control inputs of said first and second transistors receiving said first and second output potentials respectively, and said differential offset circuit outputting a voltage between said second transistor and said current source.

10. A differential amplification circuit comprising:

an amplification circuit, for amplifying a voltage between first and second input potentials to obtain first and second output potentials, including a pair of FETs and a first current source FET, each of said pair of FETs and said first current source FET comprising a gate electrode and first and second electrodes conducting a current between its first and second electrodes, the second electrodes of said pair of FETs and the first electrode of said first current source FET being coupled to one another, the gate electrodes of said pair of FET receiving said first and second input potentials respectively, the first electrodes of said pair of FETs providing said first and second output potentials respectively; and a common mode feedback circuit comprising:

a common mode signal generating circuit generating a mean potential of said first and second output potentials and shifting down the mean potential to a potential as a common mode signal, and a second current source FET comprising a gate electrode, a source electrode, and a drain electrode receiving the common mode signal, the drain and gate electrodes of said second current source FET and the gate electrode of said first current source FET are short-circuited to make a current mirror circuit comprising said first and second current source FETs, said differential amplification circuit operating between a first source potential and a second source potential, further comprising a differential offset circuit comprising:

a load element, a first control circuit, connected between said first source potential and said load element and comprising a first control input, for controlling a current flowing through said first control circuit in response to a potential at said first control input, said first control input receiving a potential corresponding to said first output potential, a current mirror circuit comprising a first input, a second input and an output connected to said second source potential, a current flowing into said first input being in proportion to a current flowing into said second input, a level shift circuit connected between said first control circuit and said first input of said current mirror circuit, and a second control circuit, connected between said first source potential and said second input and comprising a second control input, for controlling a current flowing through said second control circuit in response to a potential at said second control input, said second control input receiving a potential corresponding to said second output potential, said differential offset circuit outputting a voltage between an input of said load element and said second input of said current mirror circuit.

11. A differential amplification circuit according to claim 10, further comprising:

an intermediate buffer circuit receiving said first and second output potentials to provide first and second buffered potential corresponding to said first and second output potentials, said intermediate buffer circuit having high input impedance compared to an output impedance thereof, said first and second buffered potentials being provided to said first and second control inputs, respectively.

12. A differential amplification circuit according to claim 11, said differential amplification circuit operating between a first source potential and a second source potential, wherein said intermediate buffer circuit comprises:

first and second resistors, a first FET connected between said first source potential and said first resistor, a gate of said first FET receiving said first output potential, a second FET connected between said first source potential and said second resistor, a gate of said second FET receiving said second output potential, a third FET connected between said first resistor and said second source potential, and a fourth FET connected between said second resistor and said second source potential.

13. A differential amplification circuit according to claim 11, further comprising:

a second common mode feedback circuit controlling average potential of said first buffered potential and said second buffered potential of said intermediate buffer circuit to be constant.

14. A differential amplification circuit according to claim 13, said differential amplification circuit operating between a first source potential and a second source potential, wherein said intermediate buffer circuit comprises a FET as a current source, and wherein said-second common mode feedback circuit comprises:

a level shift diode, first and second FETs connected in series between said first source potential and said level shift diode, a first resistor connected between a gate of said second FET and said input of said load element, a second resistor connected between said gate of said second FET and said second input of said current mirror circuit, and a third FET connected between said level shift diode and said second source potential, a gate of said third FET being connected to a drain thereof and to a gate of said FET of said intermediate buffer circuit.

* * * * *

UNITED STATES PATENT AND TRADEMARK OFFICE
CERTIFICATE OF CORRECTION

PATENT NO. : 5,898,341
DATED : April 27, 1999
INVENTOR(S) : Miyashita

It is certified that error appears in the above-identified patent and that said Letters Patent is hereby corrected as shown below:

Col. 8, line 28, after "and" change "th e" to --the--;

Col. 10, line 23, "40A" should be --40--.

Col. 14, line 29, "Pair" should be --pair--.

Col. 18, line 29, "said-second" should be --said second--.

Signed and Sealed this

First Day of February, 2000

*Attest:*

Q. TODD DICKINSON

*Attesting Officer*  *Acting Commissioner of Patents and Trademarks*